(12) United States Patent
Xiao

(10) Patent No.: US 11,800,679 B2
(45) Date of Patent: Oct. 24, 2023

(54) INTEGRATED WATER COOLING HEAT SINK

(71) Applicant: ShenZhen Apaltek Co., Ltd., ShenZhen (CN)

(72) Inventor: Qineng Xiao, Guangdong (CN)

(73) Assignee: SHENZHEN APALTEK CO., LTD., Shenzhen (CN)

(*) Notice: Subject to any disclaimer, the term of this patent is extended or adjusted under 35 U.S.C. 154(b) by 487 days.

(21) Appl. No.: 17/033,864

(22) Filed: Sep. 27, 2020

(65) Prior Publication Data
US 2021/0015001 A1 Jan. 14, 2021

Related U.S. Application Data

(63) Continuation-in-part of application No. 16/470,558, filed as application No. PCT/CN2019/076226 on Feb. 27, 2019.

(30) Foreign Application Priority Data

Jan. 31, 2019 (CN) .......................... 201910096769.0
Aug. 11, 2020 (CN) .......................... 202021658096.8

(51) Int. Cl.
*H05K 7/20* (2006.01)
(52) U.S. Cl.
CPC ..... *H05K 7/20272* (2013.01); *H05K 7/20254* (2013.01)

(58) Field of Classification Search
CPC .............. F28F 2250/08; F28F 2270/00; F04D 13/0606; H01L 23/473; H05K 7/20272; H05K 7/20254
See application file for complete search history.

(56) References Cited

U.S. PATENT DOCUMENTS

| 4,320,431 A * | 3/1982 | Bell ..................... H02K 5/1672 384/627 |
| 7,544,049 B2 * | 6/2009 | Koga .................... H01L 23/473 417/423.1 |
| 7,753,662 B2 * | 7/2010 | Lai ...................... F04D 13/0606 417/423.15 |
| 10,299,406 B2 * | 5/2019 | Lin .................... H05K 7/20409 |
| 10,455,732 B2 * | 10/2019 | Pan ......................... F28D 15/00 |
| 2004/0052663 A1 * | 3/2004 | Laing ........................ G06F 1/20 257/E23.098 |
| 2006/0171801 A1 * | 8/2006 | Manabe ................ H01L 23/473 415/176 |
| 2006/0185829 A1 * | 8/2006 | Duan .................... H01L 23/473 257/E23.098 |

* cited by examiner

*Primary Examiner* — Tho V Duong
(74) *Attorney, Agent, or Firm* — Chun-Ming Shih; HDLS IPR SERVICES

(57) ABSTRACT

A heat sink provides a pump body, a pump cover, a pump module, a guide plate and a water block. The pump body is an integrally formed shell seat and forms a first chamber, a second chamber and an insulation gap. The pump cover covers the first chamber. The guide plate is combined in the second chamber and forms a heat exchange chamber. The water block includes a bottom plate and fins. The bottom plate covers the heat exchange chamber, and the fins are disposed in the heat exchange chamber. Therefore, the heat can be prevented from being transferred from the water block to the pump module.

13 Claims, 12 Drawing Sheets

INTEGRATED WATER COOLING HEAT SINK

RELATED APPLICATION

The present application is a continuation-in-part application of U.S. Ser. No. 16/470,558 filed on Jun. 18, 2019, which is National Stage Entry of PCT/CN2019076226 filed on Feb. 27, 2019, which claims priority to CN201910096769.0 filed on Jan. 31, 2019. The present application also claims priority to CN202021658096.8 filed on Aug. 11, 2020. The entire disclosures of the above applications are all incorporated herein by reference.

BACKGROUND OF THE INVENTION

Technical Field

The technical field relates to fluid cooling, and more particularly to an integrated water cooling heat sink.

Description of Related Art

Generally speaking, a liquid cooling system includes a water block, a heat dissipater and a pump, and a circulation pipeline is configured through connections of connection pipes. Moreover, in actual use, the water block is in contact with a heating element, and the circulation pipeline is filled with a working fluid, such as water. In addition, the water in the circulation pipeline is driven by the pump to circulate and flow through the water block and the heat dissipater. Thereby, the heat of the heating element will be conducted to the water block, and the heat is carried away through the heat exchange between the working fluid and the water block. Finally, the carried heat is conducted to the heat dissipater to be dissipated; therefore, the purpose of heat dissipation of the heating element will be achieved.

Furthermore, there are integrated liquid cooling heat sinks on the market, in which a pump is stacked on a water block to be combined into one-piece to achieve the effect of reducing sizes and easy installation. However, during the process of heat dissipation of the integrated liquid cooling heat sinks, as the heat generated by the heating element might be conducted to the electronic components of the pump, so that the working efficiency and service life of the pump are affected. As we all know, high heat and high temperature are fatal to the pump composed of precise rotating parts and electronic components.

In view of the above drawbacks, the Inventor proposes the present invention based on his expert knowledge and elaborate researches in order to solve the problems of prior art.

SUMMARY OF THE INVENTION

It is an object of this disclosure to provide an integrated water cooling heat sink to prevent the heat from being transferred from the water block to the pump module, so as to maintain the normal operation of the pump module.

It is another object of this disclosure to provide an integrated water cooling heat sink, in which the pump body is integrally formed and that can reduce the risk of leakage; thus, the processes and the costs are reduced.

In order to achieve the object mentioned above, the present disclosure provides a pump body, a pump cover, a pump module, a guide plate and a water block. The pump body is an integrally formed shell seat, and opposite sides of the shell seat form a first chamber and a second chamber connected to each other, and the shell seat forms an insulation gap between the first chamber and the second chamber with a spacing distance. The pump cover combines with the shell seat and covers the first chamber, and the pump cover forms a stator space on a side away from the first chamber and a cylinder protruded in the stator space. The cylinder has a rotor space communicated with the first chamber. The pump module includes a stator set disposed in the stator space, a rotor set inserted in the stator space and a vane set connected to the rotor set, and the vane set is installed in the first chamber. The guide plate is combined in the second chamber, and the guide plate forms a heat exchange chamber on a side away from the pump module. The water block includes a bottom plate and a plurality of fins. The bottom plate covers the heat exchange chamber, and the fins are disposed on the bottom plate and arranged in parallel in the heat exchange chamber.

Compared with the prior art, the pump body of the integrated water cooling heat sink of this disclosure is configured to be one piece. Compared with the traditional method of welding or structures composed of multiple components, the pump body of this disclosure can reduce joins, the risk of leakage, the processes and costs. In addition, the pump body forms an insulation gap and a plurality of hollow parts, which are disposed as thermal insulation space to isolate the heat conduction so as to prevent the heat of the heating element from being transferred from the water block to the pump module. Furthermore, the disposition of the hollow portions can reduce the weight of the pump body, and it can also reduce the material to achieve the effect of reducing cost, and the shell seat can also can be prevented from shrinking during the injection molding process so as to maintain the correct size of the shell seat and enhance the practicality of this disclosure.

BRIEF DESCRIPTION OF DRAWINGS

The features of the invention believed to be novel are set forth with particularity in the appended claims. The invention itself, however, may be best understood by reference to the following detailed description of the invention, which describes a number of exemplary embodiments of the invention, taken in conjunction with the accompanying drawings, in which:

DETAILED DESCRIPTION OF THE PREFERRED EMBODIMENTS

Figure 1:
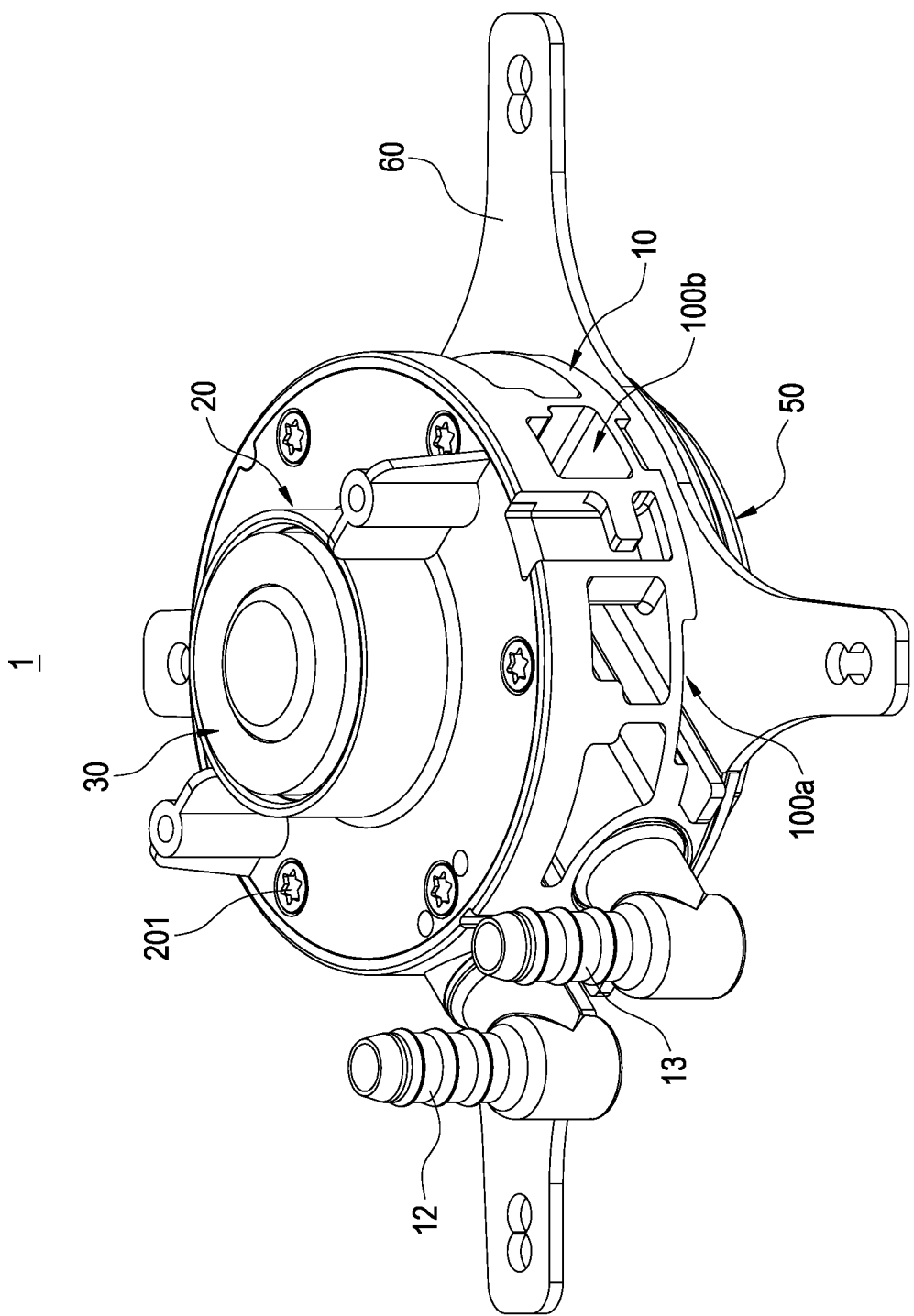
FIG. 1 is a perspective schematic view of an integrated water cooling heat sink of this disclosure.

In cooperation with attached drawings, the technical contents and detailed description of the invention are described thereinafter according to a number of preferable embodiments, being not used to limit its executing scope. Any equivalent variation and modification made according to appended claims is all covered by the claims claimed by the present invention.

Please refer to FIG. 1 and FIG. 2 to FIG. 4, which depict a perspective schematic view of an integrated water cooling heat sink of this disclosure and three cross sectional views of an integrated water cooling heat sink of this disclosure. The integrated water cooling heat sink of this disclosure includes a pump body 10, a pump cover 20, a pump module 30, a guide plate 40 and a water block 50. The pump module 30 is disposed in a pump shell configured by the pump body 10 and the pump cover 20. The guide plate 40 is assembled at a side of the pump body 10 for guiding a cooling liquid. The water block 50 is located at an outer side of the guide plate 40 and combined on the pump body 10 for attaching a heating element (not shown) to dissipate heat thereof.

In one embodiment of this disclosure, the integrated water cooling heat sink 1 further includes a fastener assembly 60. The fastener assembly 60 is combined with the pump body 10, it can provide the integrated water cooling heat sink 1 to be fastened to a fixed position such as a circuit board, etc. It should be noted that the pump body 10 forms an insulation gap 100a and a plurality of hollow parts 100b. The disposition of the insulation gap 100a and the hollow parts 100b can prevent the heat of the heating element from being conducted from the water block 50 to the pump module 30. The structures of the integrated water cooling heat sink 1 are described in more detail as follows.

Figure 5:
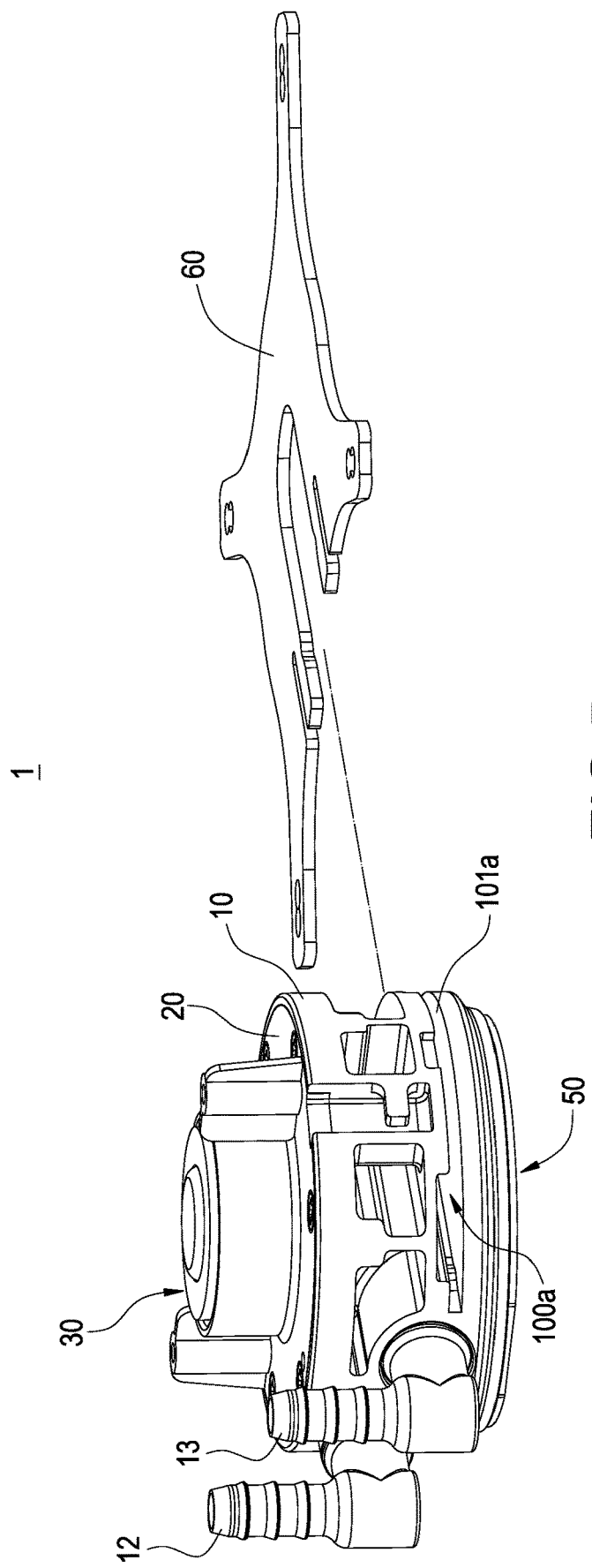
FIG. 5 is a perspective exploded schematic view of the fastener assembly of an integrated water cooling heat sink of this disclosure.
Figure 6:
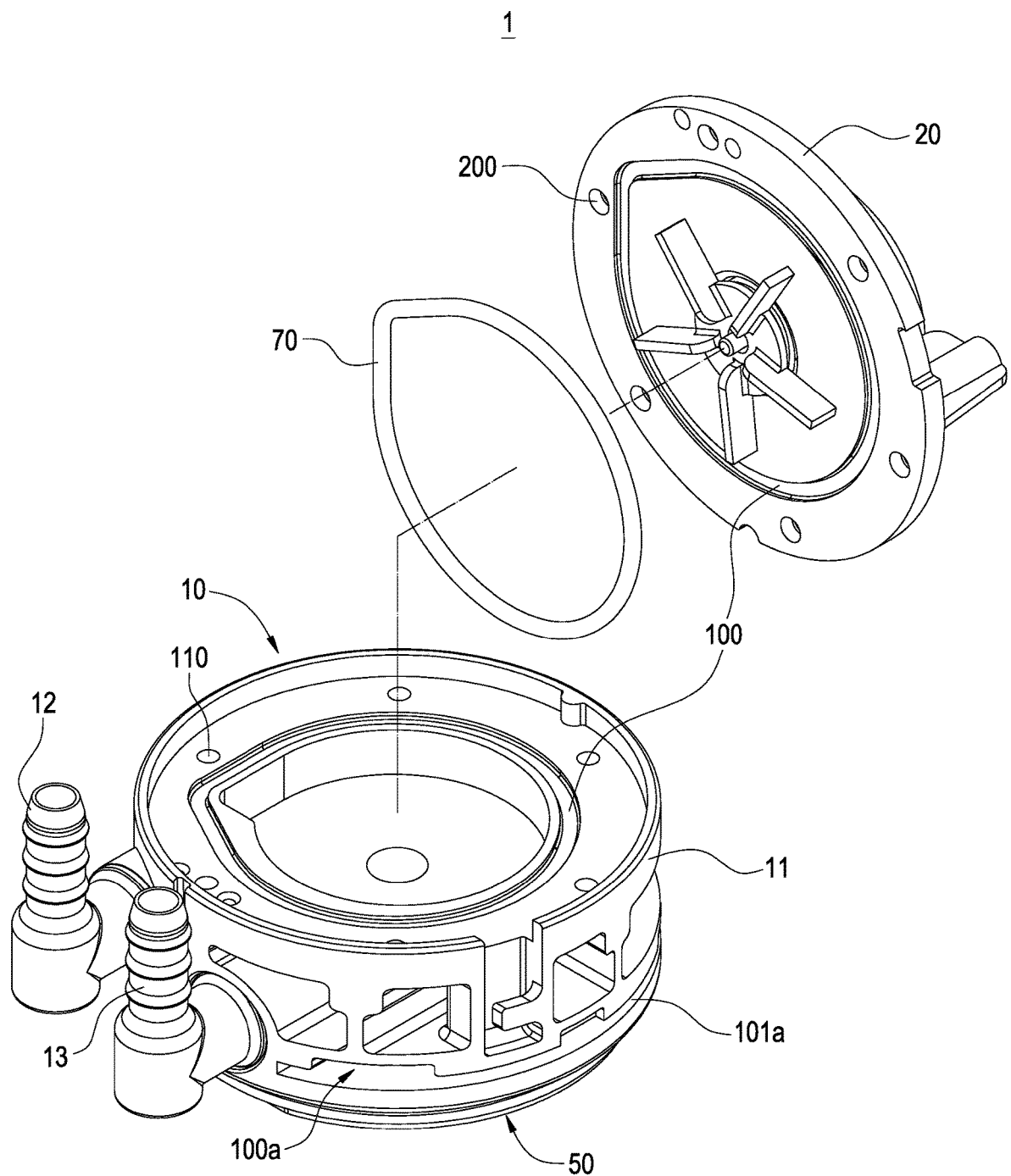
FIG. 6 is a perspective exploded schematic view of the pump cover of this disclosure.

Please refer to FIG. 5 and FIG. 6, which depict a perspective exploded schematic view of the fastener assembly of an integrated water cooling heat sink of this disclosure and a perspective exploded schematic view of the pump cover of this disclosure. As shown in FIG. 5, in the present embodiment, the insulation gap 100a includes a slot 101a for inserting the fastener assembly 60. Specifically, the slot 101a is located at a side of the insulation gap 100a neighboring the water block 50. The disposition of the fastener assembly 60 can fasten and position the integrated water cooling heat sink 1. The fastener assembly 60 is directly inserted in the slot 101a of the pump body 10 to reduce the overall volume.

Moreover, please refer to FIG. 6. Preferably, the integrated water cooling heat sink 1 further includes a waterproof gasket 70. The waterproof gasket 70 is arranged between the pump body 10 and the pump cover 20 for keeping the air tightness therebetween to prevent the cooling liquid from leaking. In more detail, the pump body 10 and the pump cover 20 forms a groove 100 at the position corresponding to the waterproof gasket 70. In addition, the waterproof gasket 70 is embedded in the groove 100.

Figure 7:
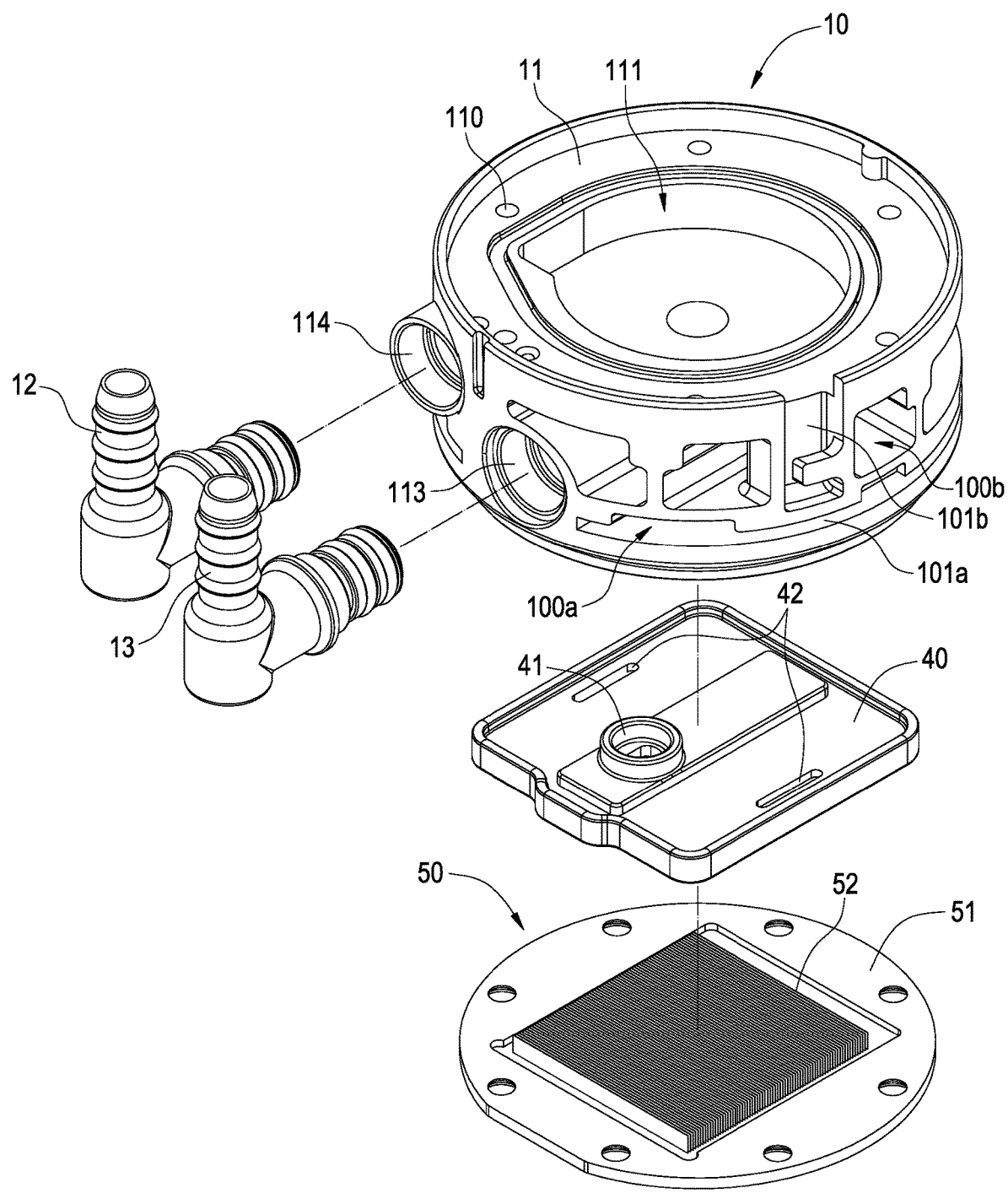
FIG. 7 and FIG. 8 are two perspective exploded schematic views of the guide plate and the water block of this disclosure.
Figure 8:
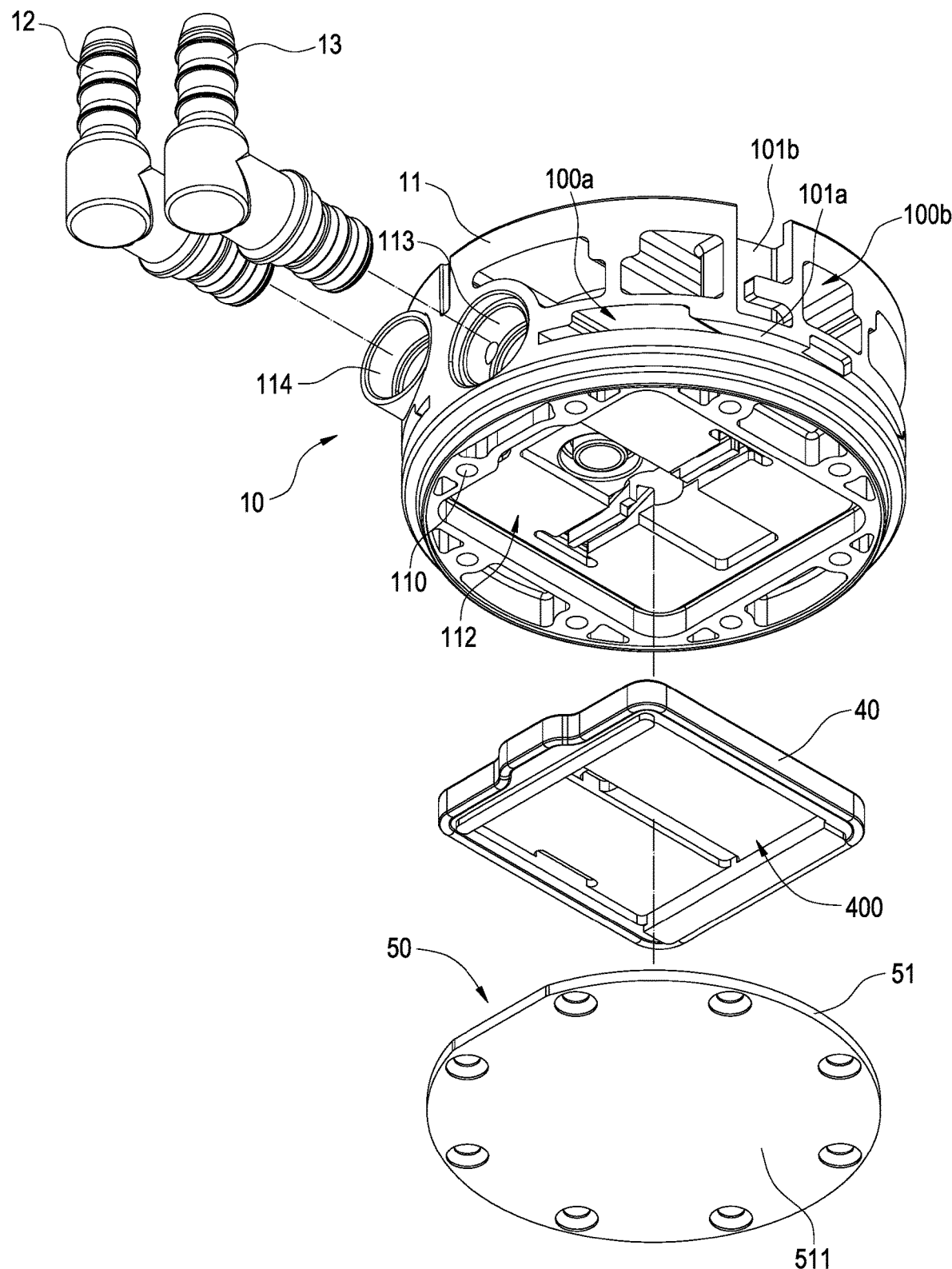

Please refer to FIG. 7 to FIG. 10, which depict two perspective exploded schematic views of the guide plate and the water block of this disclosure and two perspective exploded schematic views of the pump module and the pump cover of this disclosure. As shown in FIG. 7 and FIG. 8, the pump body 10 of the integrated water cooling heat sink 1 of this disclosure is an integrally formed shell seat 11, and opposite sides of the shell seat 11 form a first chamber 111 and a second chamber 112 connected to each other, and the shell seat 11 forms an insulation gap 100a between the first chamber 111 and the second chamber 112 with a spacing distance. In the present embodiment, the pump body 10 is made by plastic injection molding to be one-piece, but in real practice it is not limited thereto. The pump body 10 can also be configured by various molding methods such as casting or 3D printing.

It is worthy of noticing that the pump body 10 of this disclosure is configured to be one piece. Compared with the traditional method of welding or structures composed of multiple components, the pump body 10 of this disclosure can reduce joints so as to reduce the risk of leakage, and the processes and costs are reduced.

Specifically, the shell seat 11 forms a water inlet 113 and a water outlet 114, and the water outlet communicates with the firs chamber 111, and the water inlet 113 communicates with the second chamber 112. Moreover, the pump body 10 further includes an outlet pipe 12 and an inlet pipe 13. One end of the outlet pipe 12 communicates with the water outlet 114, and one end of the inlet pipe 13 communicates with the water inlet 113. In addition, the shell seat 11 forms a plurality of screw holes 110 on a periphery of the first chamber 111, and an outer surface of the shell seat 11 forms at least one wire slot 101b. The wire slot 101b is provided for hanging wires of the pump module 30.

It should be noted that in the present embodiment, the shell seat 11 forms a plurality of hollow portions 100b at positions where the first chamber 111, the second chamber 112, the water inlet 113, the water outlet 114, the screw holes 110 and the at least one wire slot 101b are not provided. That is, the sizes, shapes and positions of the hollow parts 100b are not restricted, and the disposition of the hollow parts 100b are formed at the positions of non-functional structures on the shell seat 11 according to actual conditions.

Figure 2:
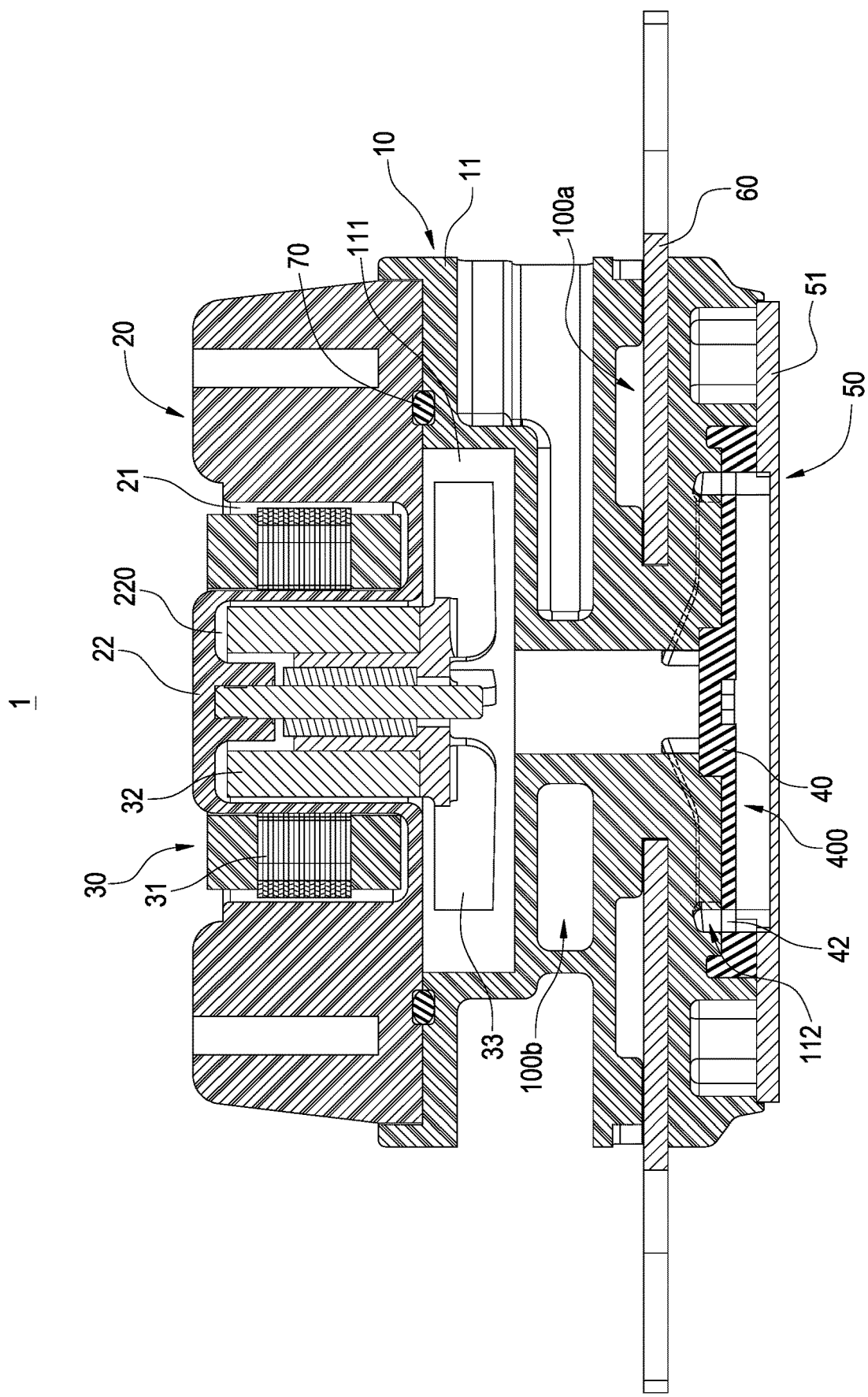
FIG. 2 to FIG. 4 are cross sectional views of an integrated water cooling heat sink of this disclosure.
Figure 3:
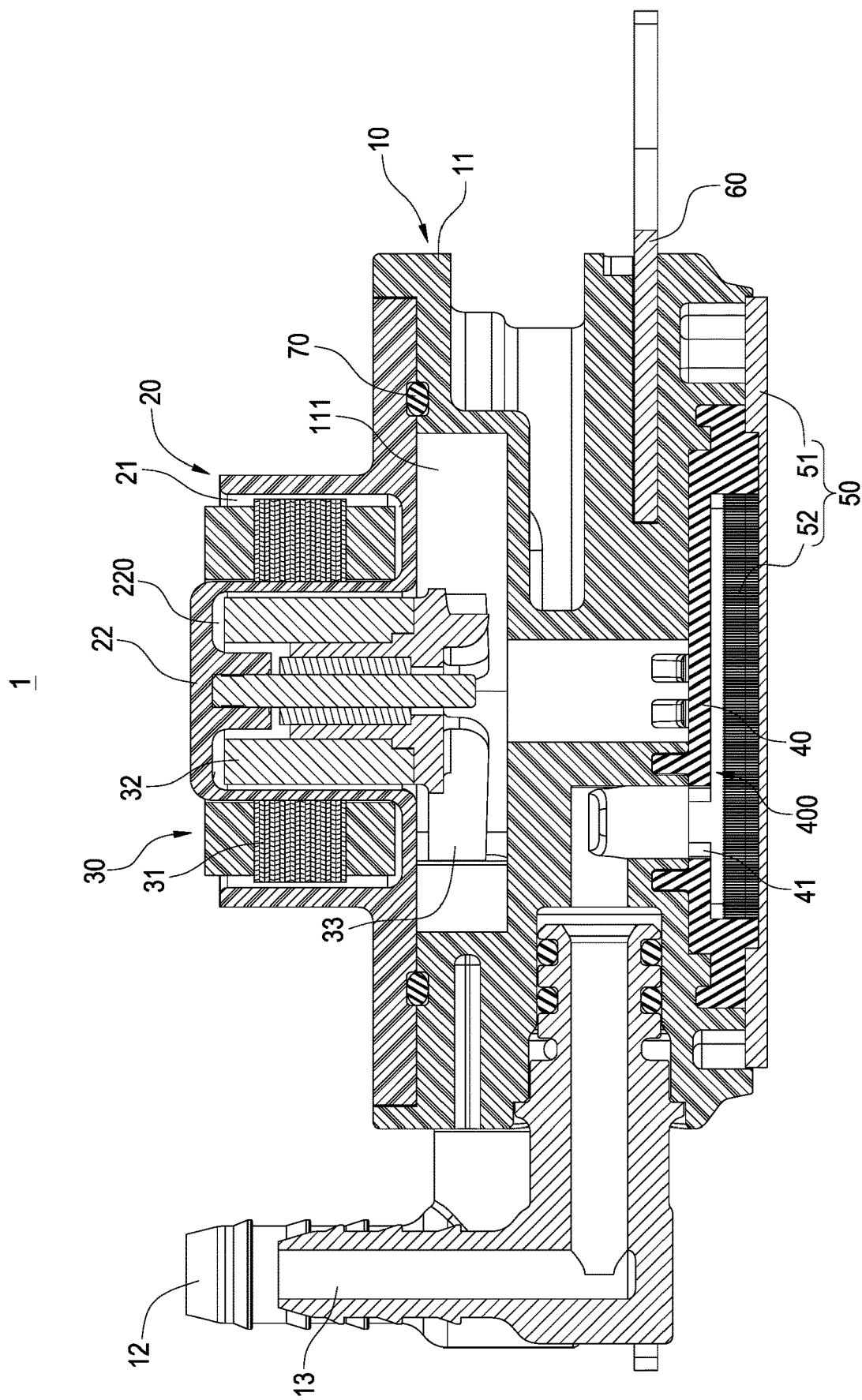
Figure 4:
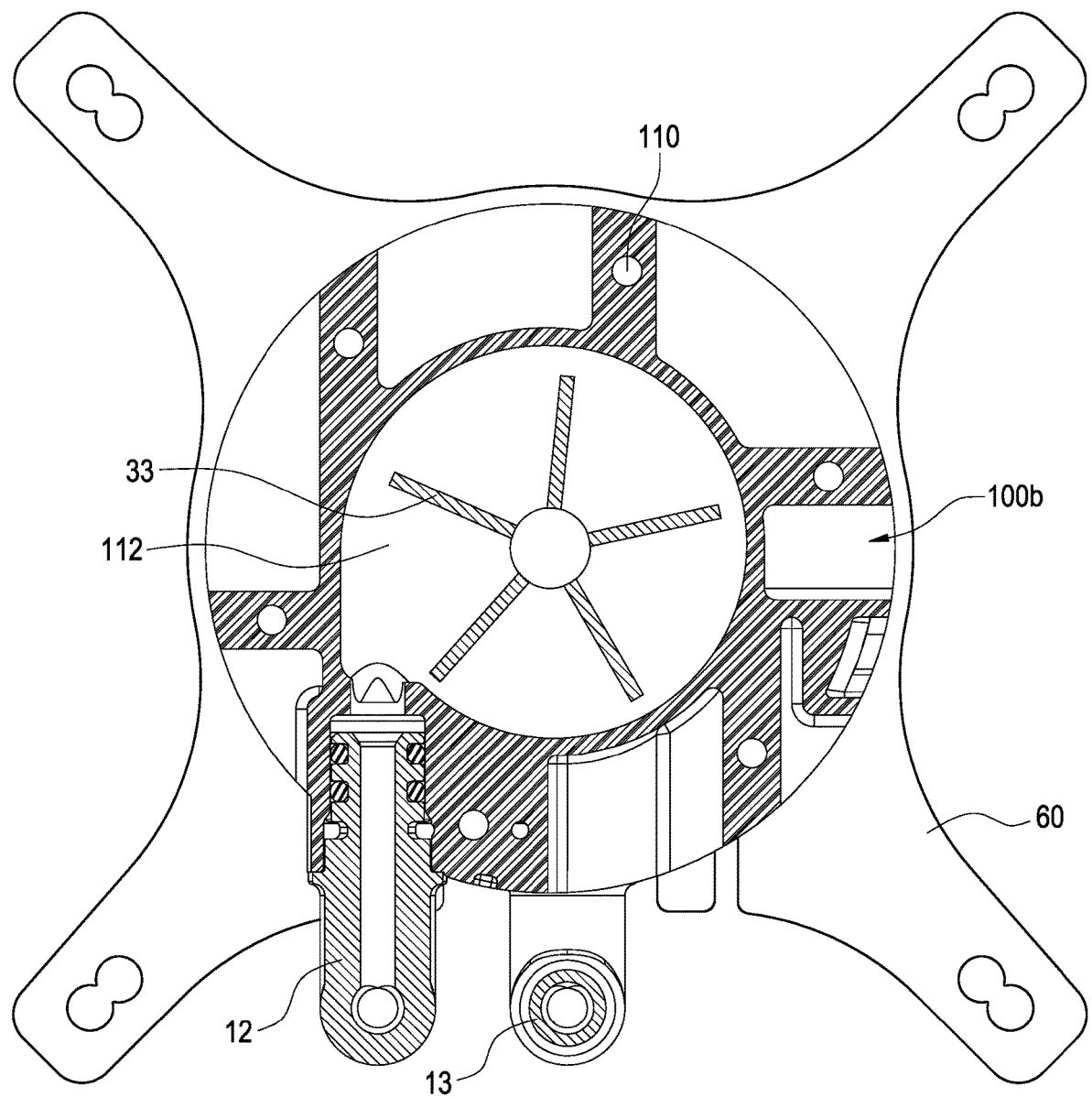

It is worthy of noticing that the disposition of the hollow portions 100b can reduce the weight of the shell seat 11, and it can also reduce the material to achieve the effect of reducing cost, and the shell seat 11 also can be prevented from shrinking during the injection molding process so as to maintain the correct size of the shell seat 11. In addition, the hollow parts 100b can also be disposed as thermal insulation space to achieve the effect of isolating heat conduction Moreover, the guide plate 40 is combined in the second chamber 112 (refer to FIG. 2 and FIG. 3) of the shell seat 11, and the guide plate 40 forms a heat exchange chamber 400 on a side away from the pump module 30. In the present embodiment, the guide plate 40 has an inlet hole 41 and at least one outlet hole 42; preferably, the number of the at least one outlet hole 42 is plural, and a plurality of outlet holes 42 are arranged relatively at two sides of the inlet hole 41. In addition, the inlet hole 41 communicates with the water inlet 113 (FIG. 3), and the at least one outlet hole 42 communicates with the second chamber 112 (FIG. 2).

Furthermore, the water block 50 includes a bottom plate 51 and a plurality of fins 52. The bottom plate 51 covers the heat exchange chamber 400. The fins are disposed on the bottom plate 51 and arranged in parallel in the heat exchange chamber 400. Preferably, the bottom plate 51 has a heat conducting plane 511 on a side away from the fins 52 for attaching a heating element.

Figure 9:
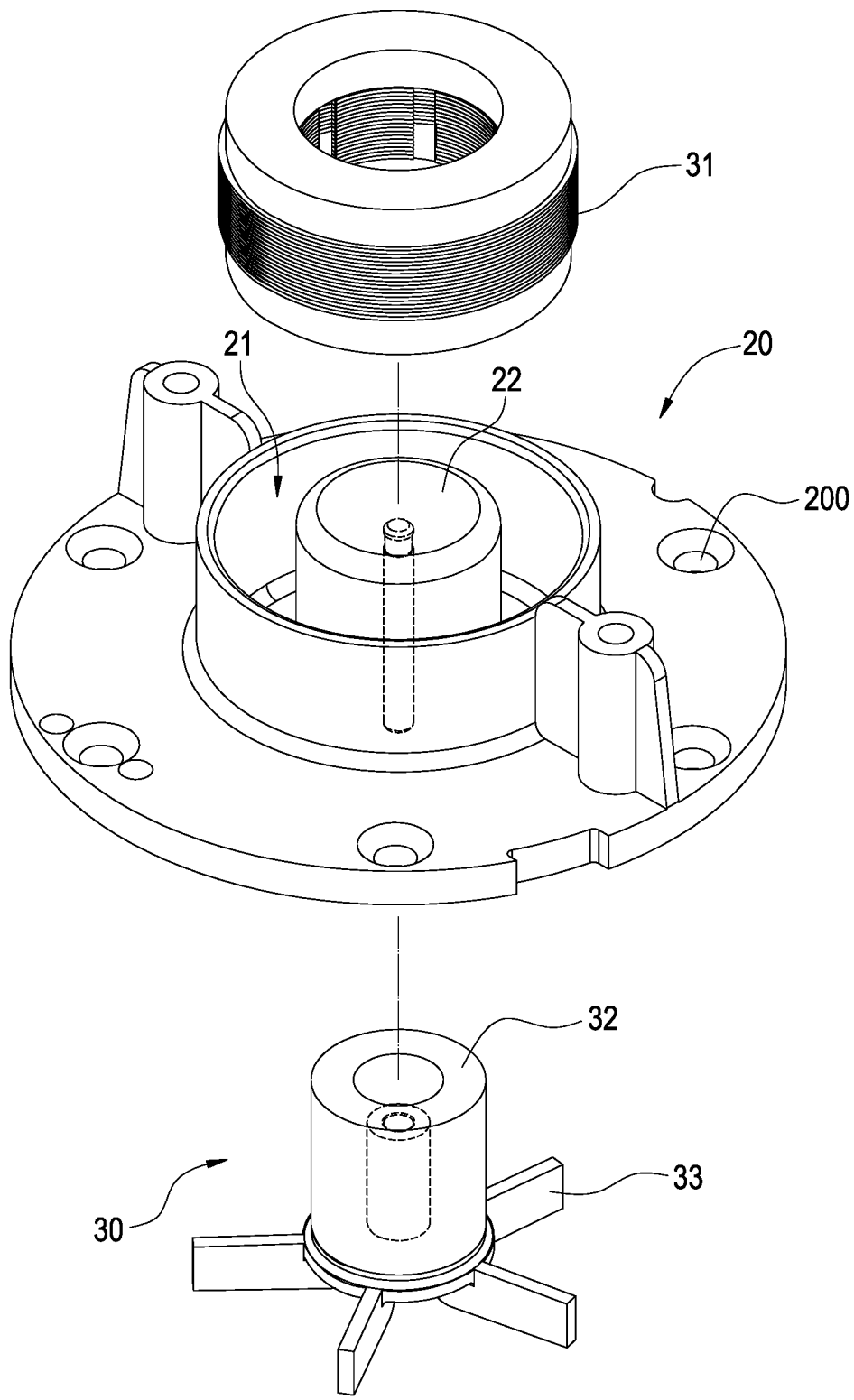
FIG. 9 and FIG. 10 are two perspective exploded schematic views of the pump module and the pump cover of this disclosure.
Figure 10:
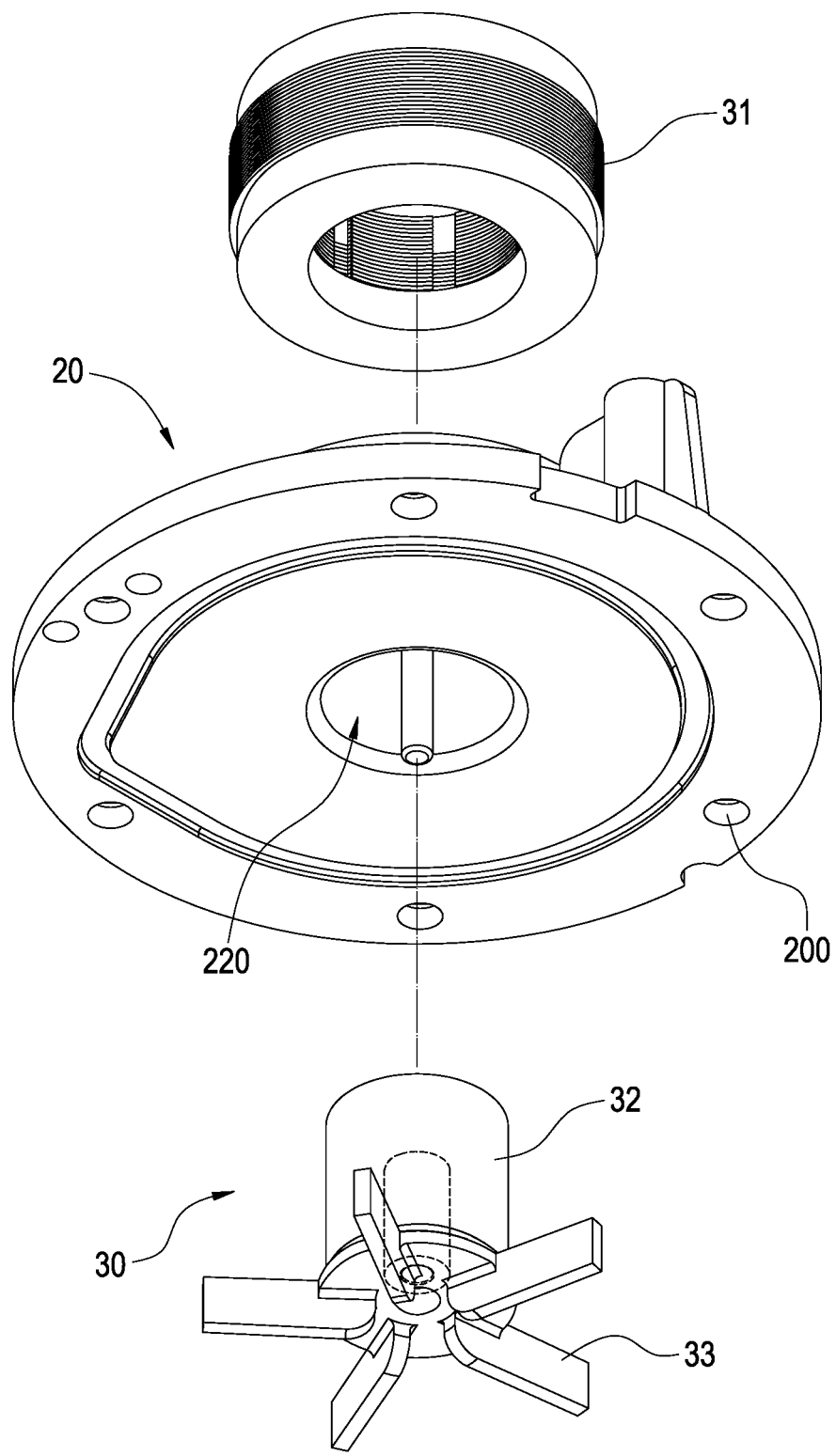

Please further refer to FIG. 9 and FIG. 10. In the present embodiment, the pump cover 20 combines with the shell seat 11 and covers the first chamber 111 (see FIG. 2). The pump cover 20 forms a stator space 21 on a side away from the first chamber 111 and a cylinder 22 protruded in the stator space 21, and the cylinder 22 has a rotor space 220 communicated with the first chamber 111. In this embodiment, the pump cover 20 is provided with a plurality of coupling holes 200 corresponded to the screw holes 110 of the shell seat 11. The pump cover 20 and the shell seat 11 are combined through a plurality of screws 201 inserted in the screw holes 110 and the coupling holes 200 separately (see FIG. 1 and FIG. 6).

Moreover, the pump module 30 includes a stator set 31 disposed in the stator space 21, a rotor set 32 inserted in the rotor space 220 and a vane set 33 connected to the rotor set 32. The vane set 33 is installed in the first chamber 111 and rotates with the rotor set 32.

Thereby, the cooling liquid flowing from the inlet pipe 13 enters the water inlet 113 and then flows into the heat exchange chamber 400 from the inlet hole 41 to take away the heat of the fins 52. Later, the cooling liquid passes through the fins 52 and flows out from the outlet hole 42 to enter the connected second chamber 112 and the first chamber 111. At this time, the cooling liquid collected in the second chamber 112 and the first chamber 111 will be pressurized under the operation of the pump module 30 and flows out from the water outlet 114 and the outlet pipe 12 so as to complete the purpose of heat exchange.

Figure 11:
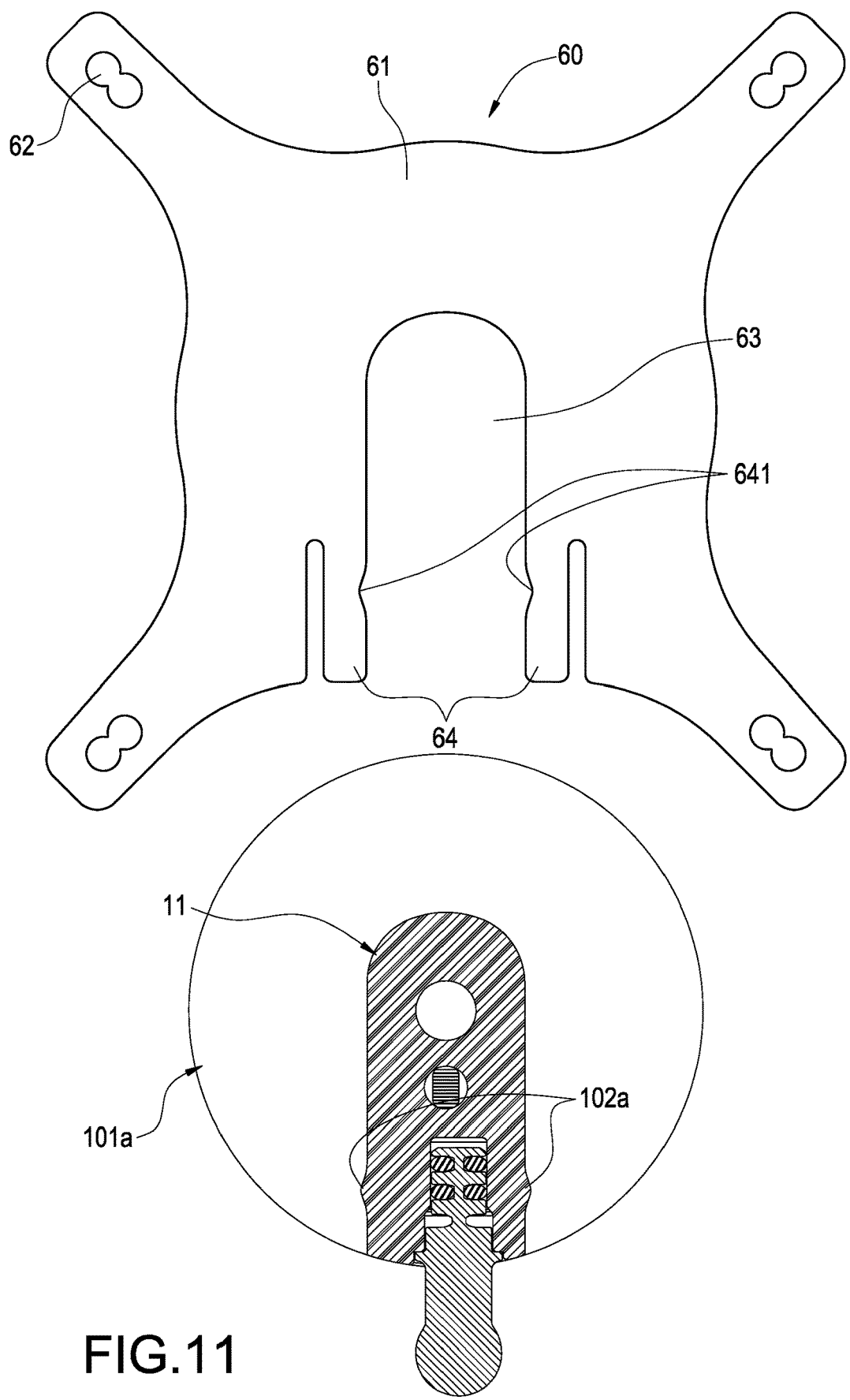
FIG. 11 and FIG. 12 are two combination schematic views of the fastener assembly of this disclosure.
Figure 12:
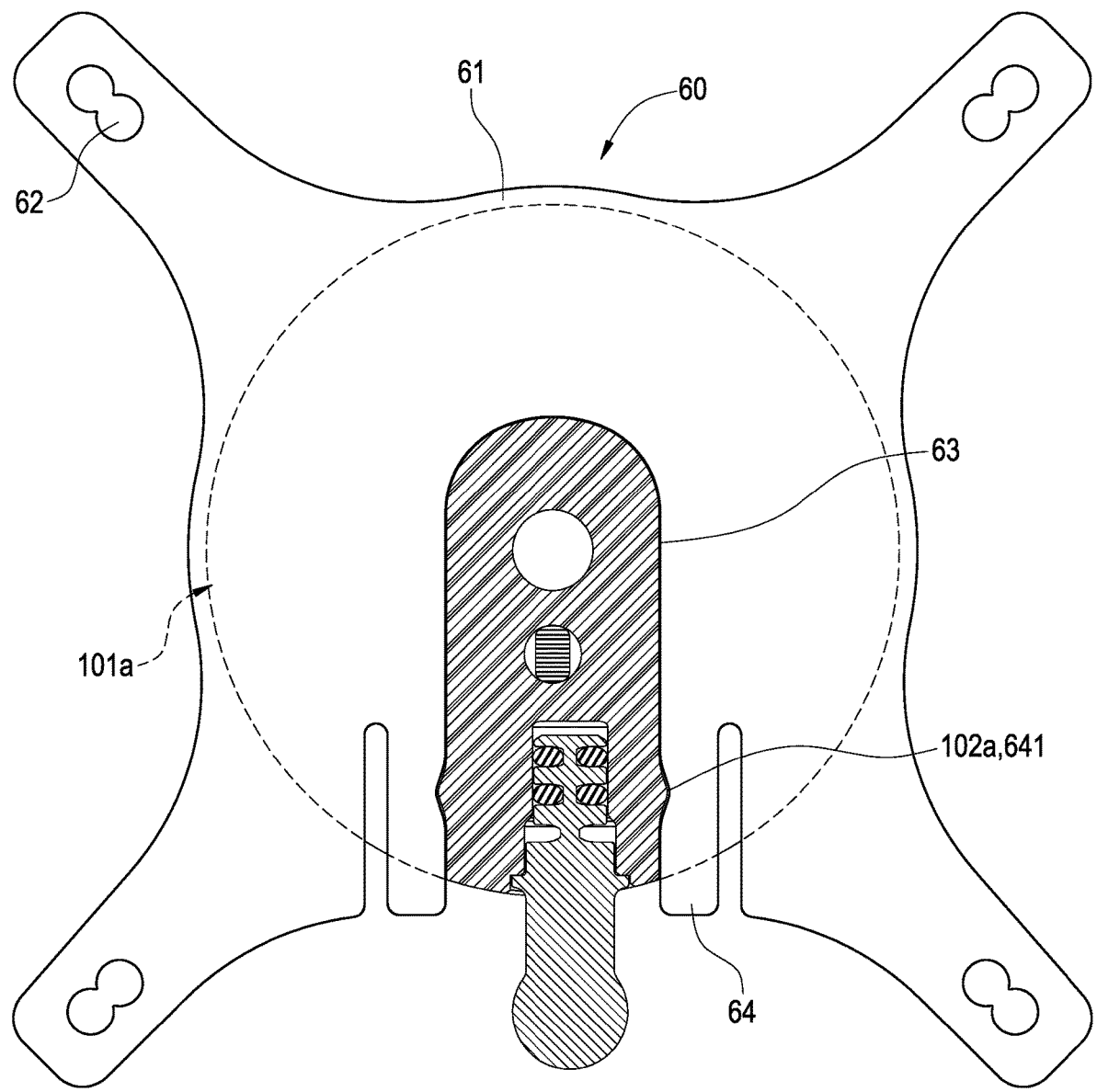

Please further refer to FIG. 11 and FIG. 12, which depict combination schematic views of the fastener assembly of this disclosure. In addition, it should be noted that in an embodiment of this disclosure, the fastener assembly 60 includes a plate 61, a plurality of fastening holes 62 disposed on the plate 61 and an insertion hole 63, and the plate 61 forms a pair of lock arms 64 at two sides of the insertion hole 63. Preferably, the pair of lock arms 64 have a pair of grooves 641. On the other hand, the shell seat 11 forms a pair of bumps 102a at the slot 101a. Accordingly, when the fastener assembly 60 is inserted in the slot 101a, the fastener assembly 60 can be positioned and combined by the engaging of the bumps 102a of the pair of lock arms 64 and the grooves 641 of the shell seat 11.

Although the present invention has been described with reference to the preferred embodiment thereof, it will be understood that the invention is not limited to the details thereof. Various substitutions and improvements have been suggested in the foregoing description, and others will occur to those of ordinary skill in the art. Therefore, all such substitutions and improvements are intended to be embraced within the scope of the invention as defined in the appended claims.

What is claimed is:

1. An integrated water cooling heat sink, comprising:
an integrally formed pump body comprising a shell seat, and opposite sides of the shell seat forming a first chamber and a second chamber connected to each other, and the shell seat forming an insulation gap between the first chamber and the second chamber with a spacing distance;
a pump cover combining with the shell seat and covering the first chamber, and the pump cover forming a stator space on a side away from the first chamber and a cylinder protruded in the stator space, and the cylinder having a rotor space communicated with the first chamber;
a pump module including a stator set disposed in the stator space, a rotor set inserted in the first chamber and a vane set connected to the rotor set, and the vane set being installed in the first chamber;
a guide plate combined in the second chamber, and the guide plate forming a heat exchange chamber on a side away from the pump module;
a water block including a bottom plate and a plurality of fins, and the bottom plate covering the heat exchange chamber, and the fins being disposed on the bottom plate and arranged in parallel in the heat exchange chamber; and
a fastener assembly, wherein the insulation gap includes a slot for inserting the fastener assembly.

2. The integrated water cooling heat sink according to claim 1, wherein the shell seat forms a water inlet and a water outlet, and the water inlet communicates with the second chamber, and the water outlet communicates with the first chamber.

3. The integrated water cooling heat sink according to claim 2, wherein the shell seat forms a plurality of screw holes on a periphery of the first chamber, and an outer surface of the shell seat forms at least one wire slot.

4. The integrated water cooling heat sink according to claim 3, wherein the shell seat forms a plurality of hollow portions at positions where the first chamber, the second chamber, the water outlet, the water inlet, the screw holes, and the at least one wire slot are not provided.

5. The integrated water cooling heat sink according to claim 3, wherein the pump cover is provided with a plurality of coupling holes corresponded to the screw holes.

6. The integrated water cooling heat sink according to claim 1, further including a waterproof gasket, wherein the waterproof gasket is arranged between the pump body and the pump cover.

7. The integrated water cooling heat sink according to claim 1, wherein the slot is located at a side of the insulation gap neighboring the water block.

8. The integrated water cooling heat sink according to claim 1, wherein the fastener assembly includes a plate, a plurality of fastening holes disposed on the plate and an insertion hole, and the plate forms a pair of lock arms at two sides of the insertion hole.

9. The integrated water cooling heat sink according to claim 1, wherein the integrally formed pump body further includes an outlet pipe and an inlet pipe.

10. The integrated water cooling heat sink according to claim 9, wherein the guide plate has an inlet hole, and the inlet hole is positioned on the guide plate and the inlet hole communicates with a water inlet formed on the shell seat, so that a cooling liquid flowing from the inlet pipe enters the water inlet and then flows into a middle portion of the heat exchange chamber from the inlet hole.

11. An integrated water cooling heat sink, comprising:
an integrally formed pump body comprising a shell seat, and opposite sides of the shell seat forming a first chamber and a second chamber connected to each other, and the shell seat forming an insulation gap between the first chamber and the second chamber with a spacing distance;
a pump cover combining with the shell seat and covering the first chamber, and the pump cover forming a stator space on a side away from the first chamber and a cylinder protruded in the stator space, and the cylinder having a rotor space communicated with the first chamber;
a pump module including a stator set disposed in the stator space, a rotor set inserted in the first chamber and a vane set connected to the rotor set, and the vane set being installed in the first chamber;
a guide plate combined in the second chamber, and the guide plate forming a heat exchange chamber on a side away from the pump module; and
a water block including a bottom plate and a plurality of fins, and the bottom plate covering the heat exchange chamber, and the fins being disposed on the bottom plate and arranged in parallel in the heat exchange chamber;

wherein the shell seat forms a water inlet, and the guide plate has an inlet hole and at least one outlet hole, and the inlet hole communicates with the water inlet, and the at least one outlet hole communicates with the second chamber.

12. The integrated water cooling heat sink according to claim 11, wherein the integrally formed pump body further includes an outlet pipe and an inlet pipe.

13. The integrated water cooling heat sink according to claim 11, wherein the inlet hole is positioned on the guide plate and the inlet hole communicates with the water inlet, so that a cooling liquid flowing from the inlet pipe enters the water inlet and then flows into a middle portion of the heat exchange chamber from the inlet hole.

\* \* \* \* \*